United States Patent
Ma et al.

(10) Patent No.: US 8,421,476 B2
(45) Date of Patent: Apr. 16, 2013

(54) FAN FAILURE DETECTOR

(75) Inventors: Ching-Cheng Ma, Pingtung (TW);
Ting-Cheng Lan, Pingtung (TW);
Chih-Hsiao Lin, Pingtung (TW)

(73) Assignee: Adda Corporation, Pingtung (TW)

(*) Notice: Subject to any disclaimer, the term of this patent is extended or adjusted under 35 U.S.C. 154(b) by 334 days.

(21) Appl. No.: 12/855,871

(22) Filed: Aug. 13, 2010

(65) Prior Publication Data
US 2012/0038305 A1   Feb. 16, 2012

(51) Int. Cl.
*G01R 31/02* (2006.01)
(52) U.S. Cl.
USPC ................. 324/555; 324/537; 318/490
(58) Field of Classification Search .......... 324/537, 324/522, 525, 713; 378/19; 307/141; 318/490
See application file for complete search history.

(56) References Cited

U.S. PATENT DOCUMENTS 3,814,950 A * 6/1974 Adams ................. 307/141
2007/0201612 A1* 8/2007 Teng et al. ............... 378/19

* cited by examiner

*Primary Examiner* — Vincent Q Nguyen
(74) *Attorney, Agent, or Firm* — Jackson IPG PLLC

(57) ABSTRACT

A fan failure detector for detecting whether a fan is locked with a drive IC, a coil and an inspection circuit, the drive IC outputting a pulse signal, the coil is electrically connected to the drive IC and driven by the drive IC, the inspection circuit is electrically connected to the drive IC and the coil, the inspection circuit includes an RC charge/discharge circuit, a diode, a second capacitor, a voltage divider and a transistor having an output terminal, wherein the RC charge/discharge circuit, the diode, the voltage divider and the transistor are sequentially connected in series, the second capacitor is electrically connected with the diode and the voltage divider, when the fan operates normally, the output terminal provides a low voltage signal, when the fan locks, the output terminal provides a high voltage signal to avoid a wrong judgment that the fan still operates normally.

8 Claims, 2 Drawing Sheets

FAN FAILURE DETECTOR

FIELD OF THE INVENTION

The present invention is generally relating to a fan failure detector, more particularly to a fan failure detector that avoids a wrong judgment that the fan still operates normally.

BACKGROUND OF THE INVENTION

With reference to FIG. 1, a conventional fan failure detector 100 is mainly composed of a motor 110, a drive unit 120 and a rotation speed detecting unit 130. The drive unit 120 is electrically connected to the motor 110 and the motor 110 is capable of being driven by the drive unit 120, the rotation speed detecting unit 130 is electrically connected to the drive unit 120, the rotation speed detecting unit 130 means for detecting the rotation speed of the motor 110, and the drive unit 120 outputs an inspection signal to a monitoring apparatus 200 to determine operating status of the motor 110. When the motor 110 operates normally, the inspection signal can be a continuous pulse signal, oppositely, when the motor 110 locks, the inspection signal can be a surge or a high voltage or a low voltage signal depends on internal predetermined value of the drive unit 120 to make the monitoring apparatus 200 to execute shut down or restart function. Once the monitoring apparatus 200 continuously receives at least two surge signals, the continuous surge signal is likely mistaken to be the continuous pulse signal so that the monitoring apparatus 200 might make a wrong judgment that the motor 110 still operates normally. Or, when the monitoring apparatus 200 receives the high voltage or the low voltage signal, exchange of magnetic poles of the motor 110 causes exchange between high voltage level and low voltage level thereby enabling the monitoring apparatus 200 make a wrong judgment that the motor 110 still operates normally.

SUMMARY

A primary object of the present invention is to provide a fan failure detector that avoids a wrong judgment that the fan still operates normally comprising a drive IC, a coil and an inspection circuit, the drive IC means for outputting a pulse signal, the coil is electrically connected to the drive IC and being driven by the drive IC, the inspection circuit is electrically connected with the drive IC and the coil, the inspection circuit comprises an RC charge/discharge circuit, a diode, a second capacitor, a voltage divider and a transistor having an output terminal, wherein the RC charge/discharge circuit, the diode, the voltage divider and the transistor are sequentially connected in series, the second capacitor is electrically connected with the diode and the voltage divider, when the fan operates normally, the output terminal outputs a low voltage signal, when the fan locks, the second capacitor discharges through the voltage divider and enables the transistor to switch into an off state, thereafter the drive IC outputs the pulse signal to make the diode into conduction and charge to the second capacitor, owning to the design of the voltage divider, the off state of the transistor can be remained, the output terminal outputs a high voltage signal to avoid a wrong judgment that the fan still operates normally. This invention applies the design of the second capacitor, the voltage divider and the transistor, when the drive IC outputs the pulse signal, terminal voltage of the voltage divider is not greater than the voltage between base and emitter terminals of the transistor so that the off state of the transistor can be remained thereby avoiding a wrong judgment that the fan still operates normally.

DETAILED DESCRIPTION OF THE INVENTION

Figure 1:
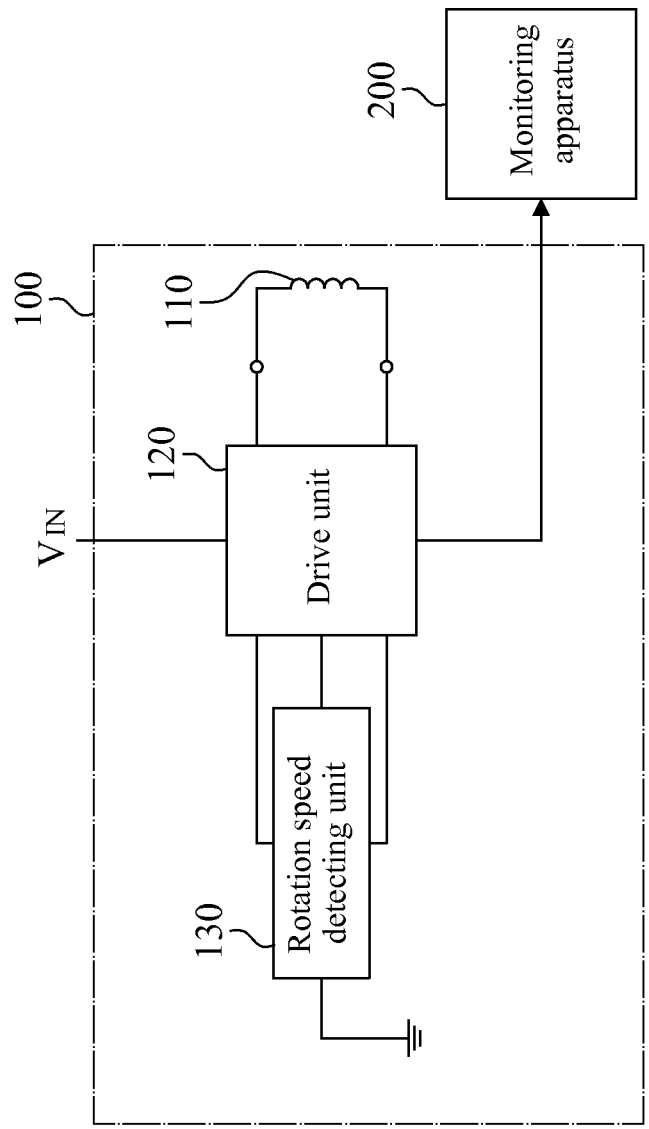
FIG. 1 is a circuit of conventional fan failure detector.
Figure 2:
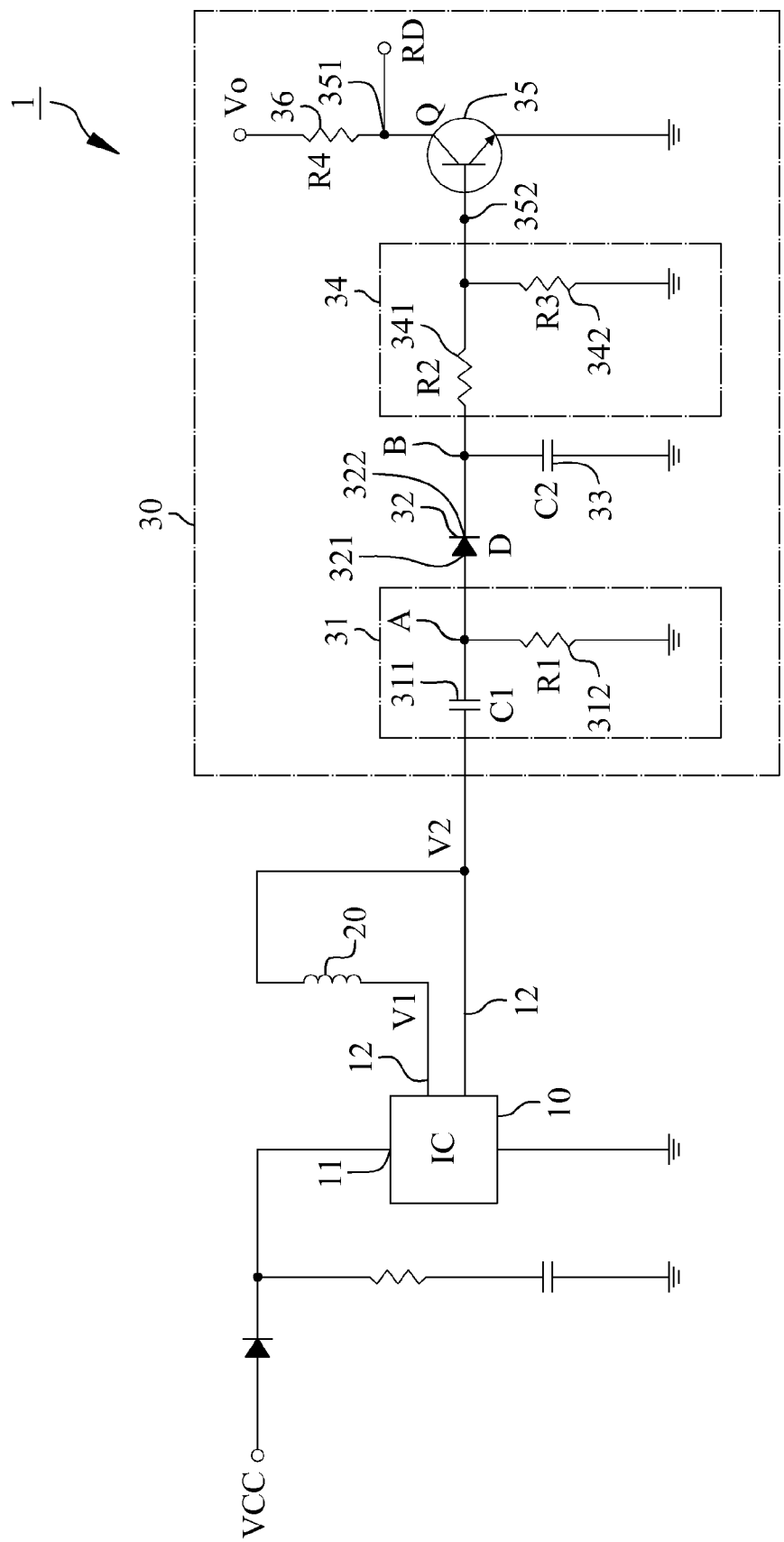
FIG. 2 is a circuit of fan failure detector in accordance with an embodiment of the present invention.

Referring to FIG. 2, a fan failure detector 1 detects whether the fan (not shown in Fig.) is locked in accordance with one embodiment of the present invention comprising a drive IC 10, a coil 20 and an inspection circuit 30, wherein the drive IC 10 outputs a pulse signal, the coil 20 is electrically connected to the drive IC 10 and driven by the drive IC 10 to activate the fan, the inspection circuit 30 is electrically connected with the drive IC 10 and the coil 20 and the inspection circuit 30 comprises an RC charge/discharge circuit 31 defining a connection node A, a diode 32 connected at the anode end 321 thereof to the node A and at the cathode end 322 to a node B, a second capacitor 33 connected between node B and circuit ground, a voltage divider 34 connected between node B and circuit ground and a transistor 35 having an output terminal 351. The RC charge/discharge circuit 31, the diode 32, the voltage divider 34 and the transistor 35 are sequentially connected in series, the second capacitor 33 is electrically connected with the diode 32 and the voltage divider 34 at node B, such that, when the fan operates normally, the output terminal 351 outputs a low voltage signal, and such that, when the fan locks, the output terminal 351 outputs a high voltage signal.

Referring to FIG. 2, the drive IC 10 has a power-receiving terminal 11, the power-receiving terminal 11 receiving a supply voltage thereby activating the drive IC 10. The RC charge/discharge circuit 31 comprises a first capacitor 311 and a first resistor 312 electrically connected to the first capacitor 311 in series at the node A in common with the anode end 321 of the diode 32. The voltage divider 34 comprises a second resistor 341 and a third resistor 342 electrically connected to the second resistor 341 in series. The transistor 35 further has a base/control terminal/node 352 which is electrically commonly connected to the voltage divider 34 series connection node. In this embodiment, the inspection circuit 30 further has a fourth resistor 36 which is electrically connected to the output terminal 351 of the transistor 35, the fourth resistor 36 and on/off state of the transistor 35 determining whether the output terminal 351 outputs the high voltage signal or the low voltage signal. The transistor 35 can be a bipolar junction transistor (BJT) or a metal-oxide-semiconductor field effect transistor (MOSFET).

Referring to FIG. 2 again, in this embodiment, the drive IC 10 further comprises a sending signal 12 which is electrically connected to the coil 20. When the fan operates normally, the sending signal 12 sends a driving signal to the coil 20 and enables the RC charge/discharge circuit 31 to start charging so that the diode 32 is in forward conduction thereby enabling the second capacitor 33 to start charging as well, then terminal voltage of the third resistor 342 of the voltage divider 34 at terminal/node 352 is greater than the voltage between the base and emitter terminal ($V_{be}$) of the transistor 35 to switch the transistor 35 into an on state, and the output terminal 351 outputs the low voltage signal. When the fan locks, the sending signal 12 of the drive IC 10 stops sending the drive signal to the coil 20, the second capacitor 33 discharges through the voltage divider 34, in this embodiment, by means of the isolation of the diode 32, discharging current of the second capacitor 33 merely flows to the voltage divider 34 instead of the first resistor 312. When terminal voltage of the third resistor 342 of the voltage divider 34 is lower than the voltage between the base and emitter terminal ($V_{be}$) of the transistor 35, the transistor 35 switches into an off state, the drive IC 10 activates an auto-restart function and the output terminal 351 outputs the pulse signal to make the diode 32 into conduction and charge to the second capacitor 33. Owing to the design of the voltage divider 34, terminal voltage of the third resistor 342 is not greater than the voltage between the base and emitter terminal ($V_{be}$) so that the off state of the transistor 35 is maintained, and the output terminal 351 outputs a high voltage signal to avoid a wrong judgment that the fan still operates normally.

This invention applies the design of the second capacitor 33, the voltage divider 34 and the transistor 35, once the sending terminal 12 of the drive IC 10 outputs the pulse signal, terminal voltage of the third resistor 342 of the voltage divider 34 is not greater than the voltage between the base and emitter terminal ($V_{be}$) of the transistor 35 so that the off state of the transistor 35 can be remained to avoid a wrong judgment that the fan still operates normally.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A fan failure detector for detecting whether a fan is locked comprising:
    a drive IC, the drive IC outputting a pulse signal;
    a coil electrically connected to the drive IC and being driven by the drive IC; and
    an inspection circuit electrically connected to the drive IC and the coil, wherein the inspection circuit comprises:
        an RC serial charge/discharge circuit serially connected between the drive IC and circuit ground and defining a first node,
        a diode connected at one end to the first node and at an opposite end to a second node,
        a second capacitor connected between the second node and circuit ground,
        a voltage divider connected between the second node and circuit ground and further defining a third node; and
        a transistor having an output terminal with the third node connected as a control input of the transistor and, wherein when the fan operates normally, the output terminal outputs a low voltage signal, and when the fan locks, the second capacitor discharges through the voltage divider and enables the transistor to switch into an off state, thereafter the drive IC outputs the pulse signal to enable the diode into conduction and charge the second capacitor, and owing to the design of the voltage divider, the off state of the transistor is maintained such that, the output terminal outputs a high voltage signal to avoid a wrong judgment that a fan still operates normally.

2. The fan failure detector in accordance with claim 1, wherein the RC charge/discharge circuit comprises a first capacitor and a first resistor electrically connected to the first capacitor at the first node.

3. The fan failure detector in accordance with claim 2, wherein the voltage divider comprises a second resistor and a third resistor electrically connected to the second resistor at the third node.

4. The fan failure detector in accordance with claim 1, wherein the inspection circuit further comprises a fourth resistor electrically connected to the signal output terminal of the transistor.

5. A fan failure detector for detecting whether a fan is locked comprising:
    a drive IC, the drive IC outputting a pulse signal;
    a coil electrically connected to the drive IC and driven by the drive IC; and
    an inspection circuit is electrically connected to the drive IC and the coil, wherein the inspection circuit comprises:
        an RC serial charge/discharge circuit serially connected between the drive IC and circuit ground and defining a first node,
        a diode connected at one end to the first node and at an opposite end to a second node,
        a second capacitor connected between the second node and circuit ground,
        a voltage divider connected between the second node and circuit ground and further defining a third node; and
        a transistor having an output terminal, with the third node connected as a control input of the transistor and, wherein, when the fan operates normally, the output terminal outputs a low voltage signal, when the fan locks, the output terminal outputs a high voltage signal.

6. The fan failure detector in accordance with claim 5, wherein the RC charge/discharge circuit comprises a first capacitor and a first resistor electrically connected to the first capacitor at the first node.

7. The fan failure detector in accordance with claim 6, wherein the voltage divider comprises a second resistor and a third resistor electrically connected to the second resistor at the third node.

8. The fan failure detector in accordance with claim 5, wherein the inspection circuit further comprises a fourth resistor electrically connected to the signal output terminal of the transistor.

* * * * *